(12) United States Patent
Takahira

(10) Patent No.: US 6,686,608 B1
(45) Date of Patent: Feb. 3, 2004

(54) NITRIDE SEMICONDUCTOR LIGHT EMITTING DEVICE

(75) Inventor: Yoshiyuki Takahira, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 09/656,766

(22) Filed: Sep. 7, 2000

(30) Foreign Application Priority Data

Sep. 10, 1999 (JP) .............................. 11-256484

(51) Int. Cl.⁷ .............................................. H01L 29/221
(52) U.S. Cl. ........................ 257/96; 257/101; 257/102; 257/190
(58) Field of Search ............................ 257/190, 94, 96, 257/101, 102, 103

(56) References Cited

U.S. PATENT DOCUMENTS

| | | | |
|---|---|---|---|
| 5,677,538 A | * | 10/1997 | Moustakas et al. .... 250/370.12 |
| 5,812,576 A | * | 9/1998 | Bour ............................ 372/45 |
| 6,064,079 A | * | 5/2000 | Yamamoto et al. .......... 257/101 |
| 6,242,761 B1 | * | 6/2001 | Fujimoto et al. .............. 257/94 |
| 6,252,894 B1 | * | 6/2001 | Sasanuma et al. ............. 372/45 |
| 6,270,587 B1 | * | 8/2001 | Motoki et al. ............. 148/33.4 |

FOREIGN PATENT DOCUMENTS

JP          07094784          7/1995

* cited by examiner

*Primary Examiner*—Sara Crane
(74) *Attorney, Agent, or Firm*—Morrison & Foerster LLP

(57) ABSTRACT

A nitride semiconductor light emitting device of the present invention includes; a GaN substrate into which a group VII element is doped; an intermediate layer section provided on the GaN substrate; and a light emitting layer provided on the intermediate layer section. The intermediate layer section has a sufficient thickness to prevent the group VII element diffused from the GaN substrate from being detected in the light emitting layer.

34 Claims, 12 Drawing Sheets

US 6,686,608 B1

NITRIDE SEMICONDUCTOR LIGHT EMITTING DEVICE

BACKGROUND OF THE INVENTION

1. Field of the Invention

The present invention relates to a nitride semiconductor light emitting device.

2. Description of the Related Art

A light emitting device using a gallium nitride type compound semiconductor material can emit light of a wide range of wavelengths from blue to orange by adjusting the composition of each compound semiconductor layer. FIG. 12 illustrates a conventional nitride semiconductor light emitting device 1200 using a GaN substrate as disclosed in Japanese Laid-Open Publication No. 7-94784. First, a GaN substrate 33 is produced through a CVD method with materials such as Ga, HCl, $NH_3$, and the like. Then, an n-GaN layer 34, an InGaN light emitting layer 35, and a p-GaN layer 36 are deposited on the GaN substrate 33, thereby providing a layered structure. Electrodes 31 and 32 are respectively provided on the outermost layers of the layered structure.

However, with such a conventional technique, it is not possible to obtain a light emitting diode having an improved emission efficiency or a semiconductor laser device having a reduced threshold current (i.e., a prolonged operating lifetime). There has been a demand for a novel technique for obtaining a light emitting diode having an improved emission efficiency and a prolonged operating lifetime.

SUMMARY OF THE INVENTION

According to one aspect of this invention, there is provided a nitride semiconductor light emitting device, including: a GaN substrate into which a group VII element is doped; an intermediate layer section provided on the GaN substrate; and a light emitting layer provided on the intermediate layer section. The intermediate layer section has a sufficient thickness to prevent the group VII element diffused from the GaN substrate from being detected in the light emitting layer.

In one embodiment of the invention, the thickness of the intermediate layer section is equal to or greater than about 0.2 µm.

In one embodiment of the invention, the group VII element has a concentration in a range of about $1 \times 10^{16}$ cm$^{-3}$ to about $1 \times 10^{20}$ cm$^{-3}$.

In one embodiment of the invention, the intermediate layer section comprises a layer into which a group IV element or a group VI element is doped in a range of about $1 \times 10^{17}$ cm$^{-3}$ to about $1 \times 10^{20}$ cm$^{-3}$.

In one embodiment of the invention, the group VII element is Cl.

In one embodiment of the invention, the GaN substrate is an n-type substrate, and the dopant for the Intermediate layer section is an n-type dopant.

In one embodiment of the invention, the intermediate layer section comprises a plurality of doped nitride semiconductor layers, and one of the plurality of doped nitride semiconductor layers closest to the GaN substrate has a dopant concentration which is greater than that of another one of the plurality of doped nitride semiconductor layers closest to the light emitting layer.

In one embodiment of the invention, the nitride semiconductor light emitting device is a semiconductor laser device;

the intermediate layer section comprises a plurality of layers including an n-InGaN base layer, an n-AlGaN cladding layer and an n-InGaN guide layer, which are arranged in this order from the GaN substrate side; and the intermediate layer section has a total thickness equal to or greater than about 0.5 µm.

In one embodiment of the invention, a dopant concentration in the n-AlGaN cladding layer and the n-InGaN guide layer of the intermediate layer section is equal to or greater than about $1 \times 10^{17}$ cm$^{-3}$ and less than or equal to about $1 \times 10^{19}$ cm$^{-3}$.

In one embodiment of the invention, the n-AlGaN cladding layer has a thickness less than or equal to about 1.5 µm.

In one embodiment of the invention, the nitride semiconductor light emitting device is a semiconductor laser device; the Intermediate layer section comprises a plurality of layers including an n-InGaN base layer, an n-AlGaInN cladding layer and an n-InGaN guide layer, which are arranged in this order from the GaN substrate side; and the intermediate layer section has a total thickness equal to or greater than about 0.5 µm.

In one embodiment of the invention, a dopant concentration in the n-AlGaInN cladding layer and the n-InGaN guide layer of the intermediate layer section is equal to or greater than about $1 \times 10^{17}$ cm$^{-3}$ and less than or equal to about $1 \times 10^{19}$ cm$^{-3}$.

In one embodiment of the invention, the n-AlGaInN cladding layer has a thickness less than or equal to about 1.5 µm.

Thus, the invention described herein makes possible the advantage of providing a light emitting device using a gallium nitride type compound semiconductor material having an improved emission efficiency and a prolonged operating lifetime.

This and other advantages of the present invention will become apparent to those skilled in the art upon reading and understanding the following detailed description with reference to the accompanying figures.

DESCRIPTION OF THE PREFERRED EMBODIMENTS

The present invention will now be described by way of illustrative examples.

Embodiment 1

Figure 1:
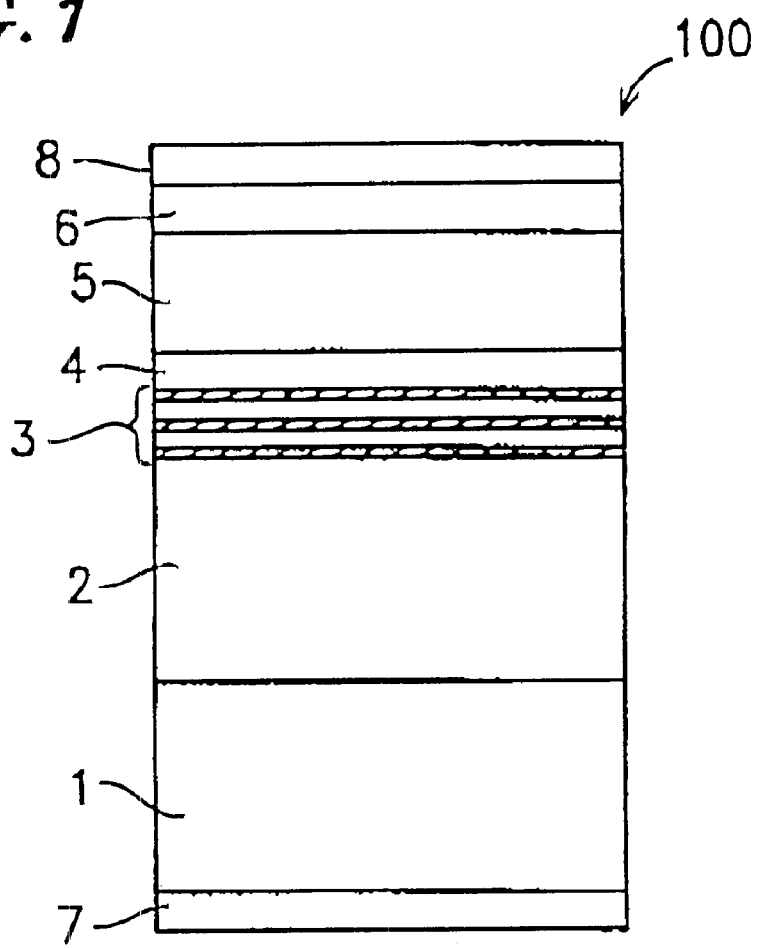
FIG. 1 is a schematic cross-sectional view illustrating a structure of a nitride semiconductor light emitting device according to one embodiment of the present invention.

FIG. 1 illustrates the structure of a nitride semiconductor light emitting device 100 according to Embodiment 1 of the present invention. The light emitting device 100 includes an n-GaN layer 2, an InGaN-MQW (multiple quantum well) light emitting layer 3 (emission wavelength: about 460 nm), a p-AlGaN layer 4, a p-GaN layer 5 and a p$^+$-GaN contact layer 6, which are provided in this order on an n-GaN substrate 1, thereby forming a layered structure. The light emitting device 100 further includes an n-type electrode 7 and a p-type electrode 8 respectively provided on the outermost layers of the layered structure. In this embodiment, the n-GaN layer 2 functions as an intermediate layer section.

The light emitting device 100 shown in FIG. 1 can be produced as follows. First, GaN is deposited on an Si substrate while adding chlorine (Cl) thereto, and then only Si is selectively etched away from the substrate, thus obtaining the GaN substrate 1.

On the thus obtained Cl-doped GaN substrate 1 (Cl: about $5\times10^{16}$ cm$^{-3}$), the n-GaN layer 2 (doped with Si: about $5\times10^{19}$ cm$^{-3}$, thickness: about 0.2 $\mu$m), the InGaN-MQW light emitting layer 3, the p-AlGaN layer 4, the p-GaN layer 5 and the p$^+$-GaN contact layer 6 are deposited in this order through a known process using an MOCVD method. The following materials can be used in this embodiment. NH$_3$ gas is used as a nitrogen source, trimethylgallium (hereinafter, referred to as "TMG") gas is used as a Ga source, and trimethylindium (hereinafter, referred to as "TMI") gas is used as an In source. The n-GaN layer 2 is grown at about 1100° C., the InGaN-MQW light emitting layer 3 at about 600° C. to about 900° C., and the p-AlGaN layer 4 and the p-GaN layer 5 at about 1000° C. While an MOCVD method is used in this embodiment, any other appropriate method can be used in this embodiment.

Figure 2:
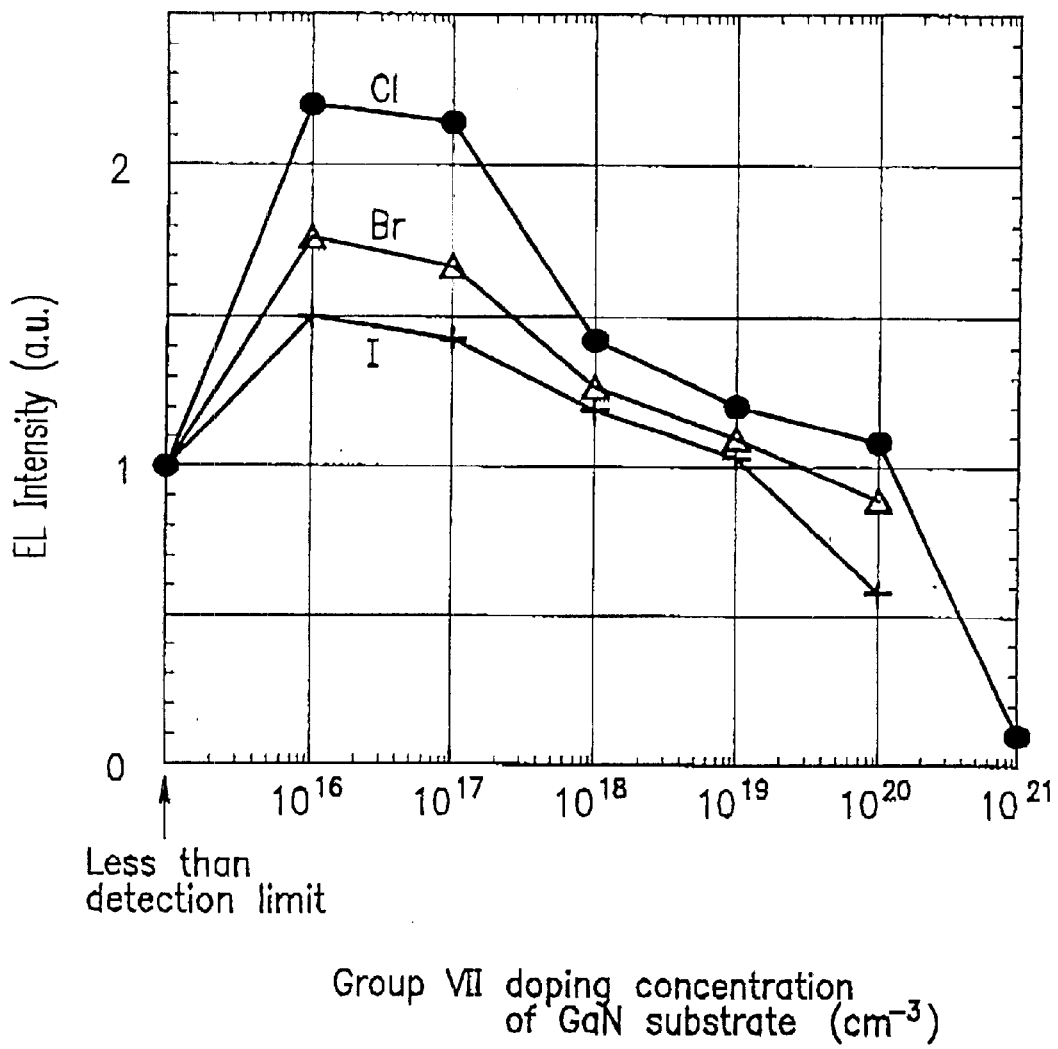
FIG. 2 is a graph illustrating the relationship between the amount of a group VII element added to a GaN substrate and the emission intensity.

FIG. 2 is a graph illustrating the relationship between the concentration of a group VII element doped into a GaN substrate and the emission intensity (electroluminescent intensity) of the produced device. It can be seen from FIG. 2 that a device whose GaN substrate is doped with Cl in a concentration range of about $1\times10^{16}$ cm$^{-3}$ to about $1\times10^{20}$ cm$^{-3}$ has desirable emission characteristics over a device in which the group VII concentration of the GaN substrate is less than the detection limit (about $10^x$cm$^{-3}$). It can also be seen from FIG. 2 that for other group VII elements, namely Br and I, desirable emission characteristics can be obtained when the doping concentration is In the range of about $1\times10^{16}$ cm$^{-3}$ to about $1\times10^{19}$ cm$^{-3}$. When a GaN substrate is doped with a group VII element, the initial stage of growing various layers on the GaN substrate can be done with a low V/III ratio as compared to the case where a GaN substrate is not doped with group VII element. This promotes the migration of the group III element and suppresses the spiral growth around a nucleus formed by a threading dislocation existing in the GaN substrate. It is believed that this allows the InGaN light emitting layer to be uniformly grown, thereby increasing the emission intensity. It can further be seen from FIG. 2 that Cl gives the most desirable characteristics among these group VII elements. It is believed that this is because the atomic radii of these group VII elements have the relationship of Cl<Br<I and that the smaller the atomic radius, the smaller is the distortion, and so the smaller is the influence of the distortion on a layer grown on the substrate.

As described above, in the present embodiment, the GaN substrate 1 is obtained by first depositing GaN on an Si substrate while adding Cl thereto, and then selectively etching away only Si from the substrate. Alternatively, a GaN substrate doped with a group VII element may be obtained by any other appropriate method.

The light emitting device 100 is produced so that the concentration of the group VII element in each of the n-GaN layer 2 and the InGaN-MQW light emitting layer 3 is less than about $1\times10^{16}$ cm$^{-3}$, which is the detection limit at present.

The n-type electrode 7 and the p-type electrode 8 can be vapor-deposited through a known process using an EB vapor deposition apparatus. Ti/Al may be used as the material of the n-type electrode 7, and Pd/Au may be used as the material of the p-type electrode 8.

Figure 3:
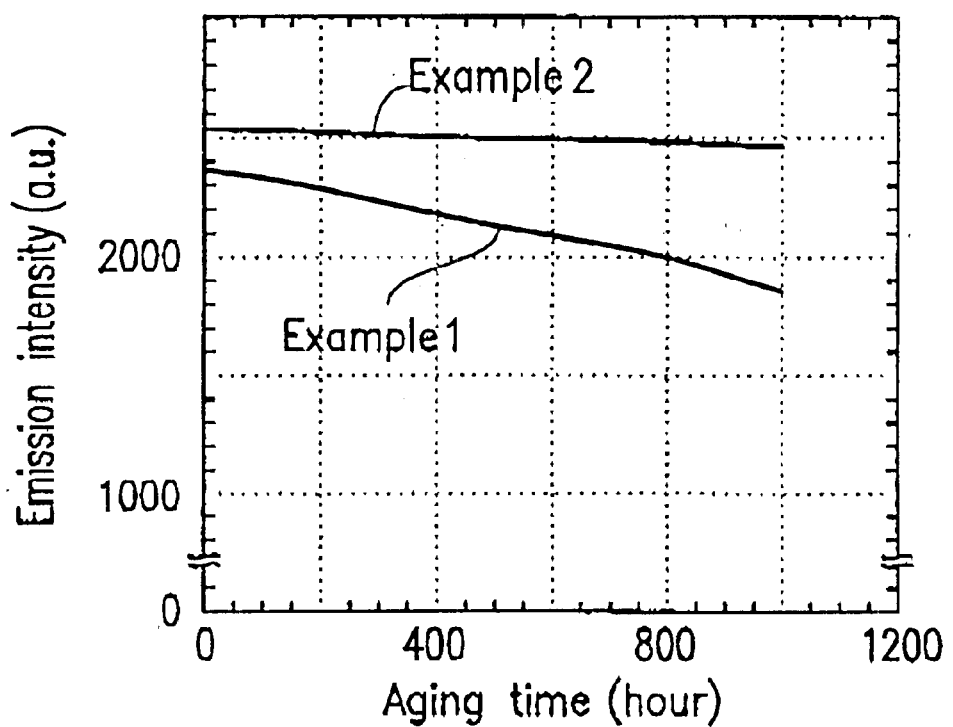
FIG. 3 illustrates lifetime characteristics of a nitride semiconductor light emitting device according to one embodiment of the present invention.

FIG. 3 is a graph illustrating the relationship between the aging time of the nitride semiconductor light emitting device 100 according to the present embodiment and the emission intensity thereof. Thus, FIG. 3 shows the lifetime characteristics of the nitride semiconductor light emitting device 100. As can be seen from FIG. 3, the nitride semiconductor light emitting device 100 according to the present embodiment has an emission intensity equal to or greater than 80% of the initial emission intensity even after about 1000 hour aging.

Figure 4:
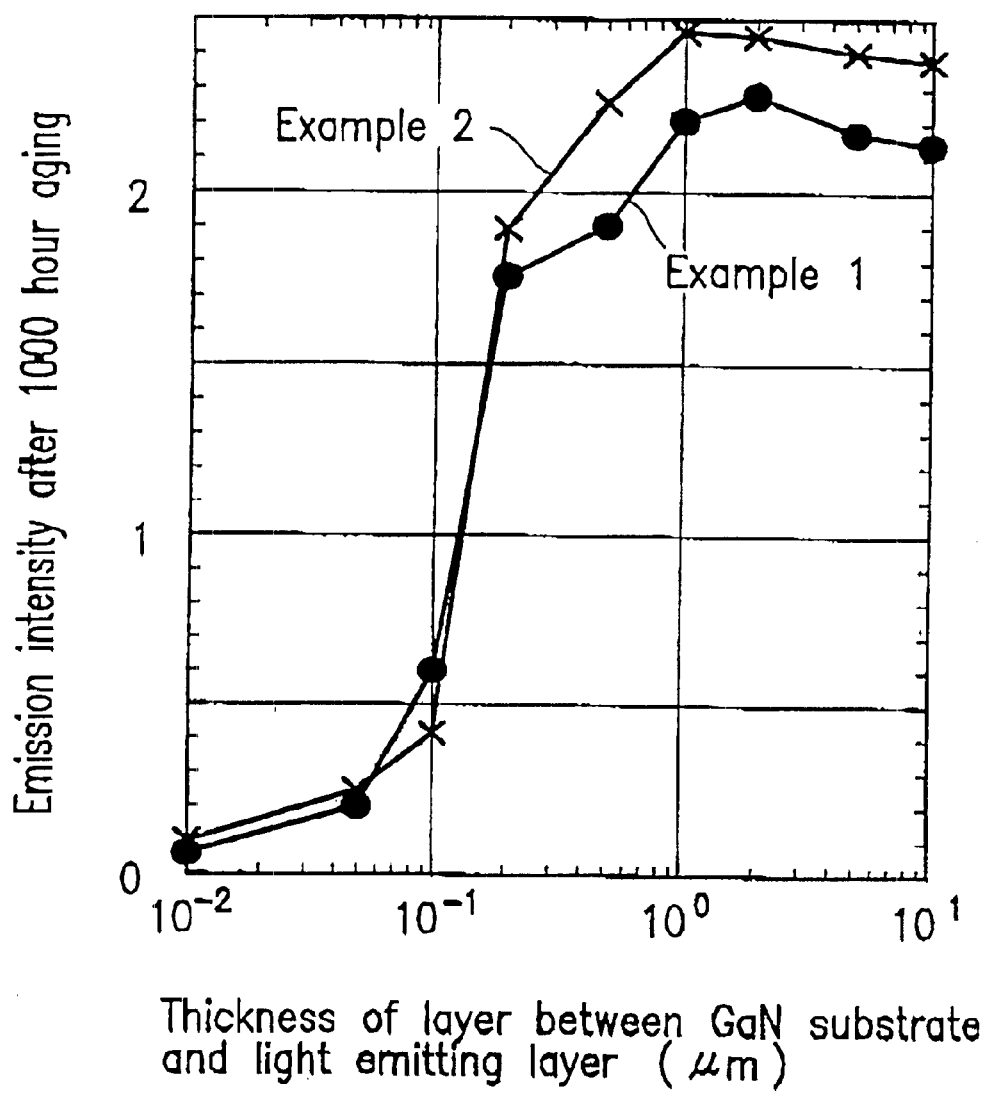
FIG. 4 is a graph illustrating the relationship between the thickness of a layer provided between a GaN substrate and a light emitting layer and the optical output after about 1000 hours of aging (after about 1000 hour aging)

FIG. 4 is a graph illustrating the relationship between the thickness of the n-GaN layer 2 of the nitride semiconductor light emitting device 100 according to the present embodiment and the optical output thereof after about 1000 hour aging. It can be seen from FIG. 4 that the device provides a greater optical output when the thickness of the n-GaN layer 2 is equal to or greater than about 0.2 $\mu$m, and thus better lifetime characteristics, as compared to those when the thickness of the n-GaN layer 2 is less than about 0.2 $\mu$m.

Figure 5:
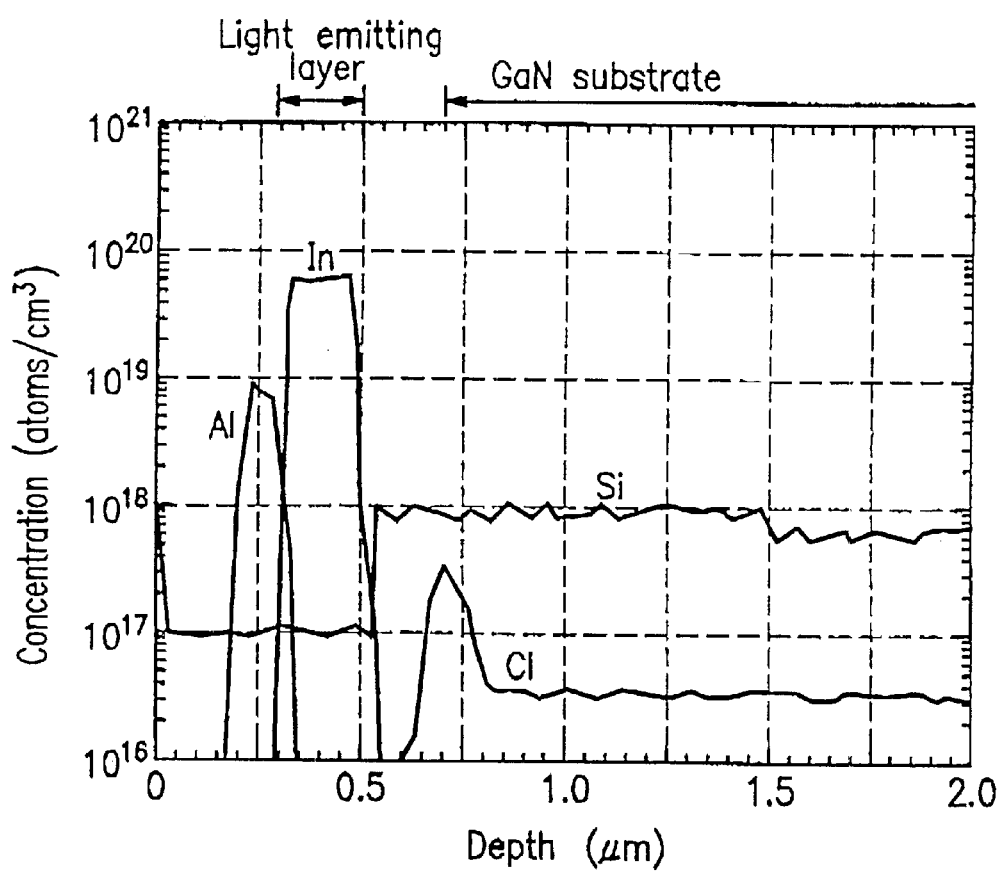
FIG. 5 shows SIMS results of a device in which a layer provided between a GaN substrate and a light emitting layer has a thickness of about 0.2 µm, after about 1000 hour aging.
Figure 6:
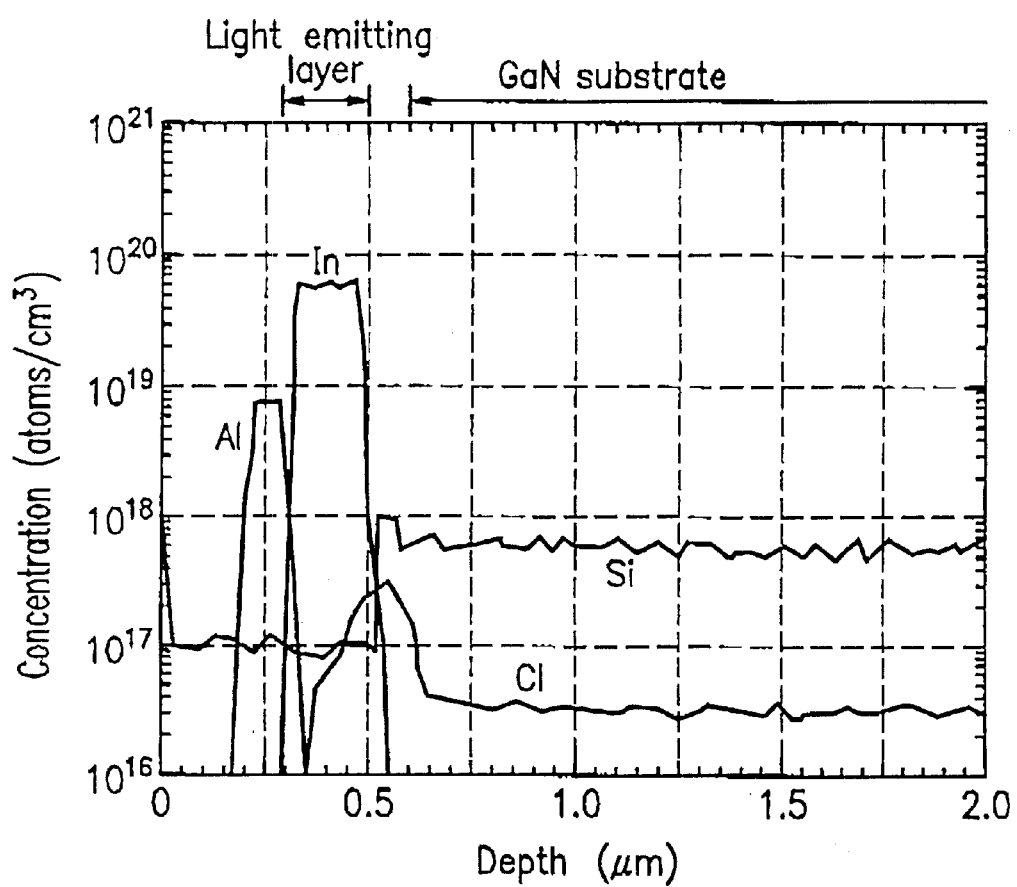
FIG. 6 shows SIMS results of a device in which a layer provided between a GaN substrate and a light emitting layer has a thickness of about 0.1 µm, after about 1000 hour aging.

FIG. 5 shows the results of a SIMS (secondary ion mass spectrometry) measurement after about 1000 hour aging for a device in accordance with the invention in which the n-GaN layer 2 has a thickness of about 0.2 $\mu$m (as described above, a device which has desirable characteristics after about 1000 hour aging). In FIG. 5, the vertical axis represents the atomic concentration, and the horizontal axis represents the depth in the device with respect to the interface between the p-type electrode 8 and the p$^+$-GaN contact layer 6. It can be seen from FIG. 5 that while Cl is present on the order of $10^7$ cm$^{-3}$ in the vicinity of the interface between the GaN substrate 1 and the n-GaN layer 2 (depth: about 0.7 μm), the Cl concentration in the light emitting layer 3 is below the detection limit by SIMS (about $10^{16}$ cm$^{-3}$). As a comparative example, FIG. 6 shows the results of a SIMS measurement after about 1000 hour aging for another device in which the n-GaN layer 2 has a thickness of only about 0.1 μm (a device whose emission intensity is significantly reduced after about 1000 hour aging). The SIMS results show that a device in which the thickness of the layer provided between the GaN substrate and the light emitting layer is about 0.1 μm will have Cl in the light emitting layer after aging. It is believed that this is the cause of the significant reduction in the emission intensity after aging.

It has been confirmed that a device in which the thickness of the n-GaN layer 2 (the intermediate layer section) is increased over about 10 μm has characteristics substantially the same as those of a device In which the thickness of the n-GaN layer 2 (the intermediate layer section) is about 10 μm. Thus, referring again to FIG. 4, it can be seen that desirable characteristics can be obtained with a device in which the thickness of the n-GaN layer 2 (the intermediate layer section) is equal to or greater than about 0.2 μm, up to at least 10 μm. Desirable characteristics have been confirmed for devices in which the respective thicknesses of the n-GaN layer 2 were about 0.2 μm, about 0.5 μm, about 1 μm, about 2 μm, about 5 μm and about 10 μm.

Where the aging time is 1000 hours, the device characteristics remain to be desirable even when the dopant for the n-GaN layer 2 is changed from Si to Se, S. Sn, Ge or Te (Si, Ge and Sn belong to group IV, and S, Se and Te belong to group VI). It has also been confirmed that the device characteristics are desirable when the doping concentration for the n-GaN layer 2 is In the range of about $1 \times 10^{16}$ cm$^{-3}$ to about $10^{21}$ cm$^{-3}$.

Figure 7:
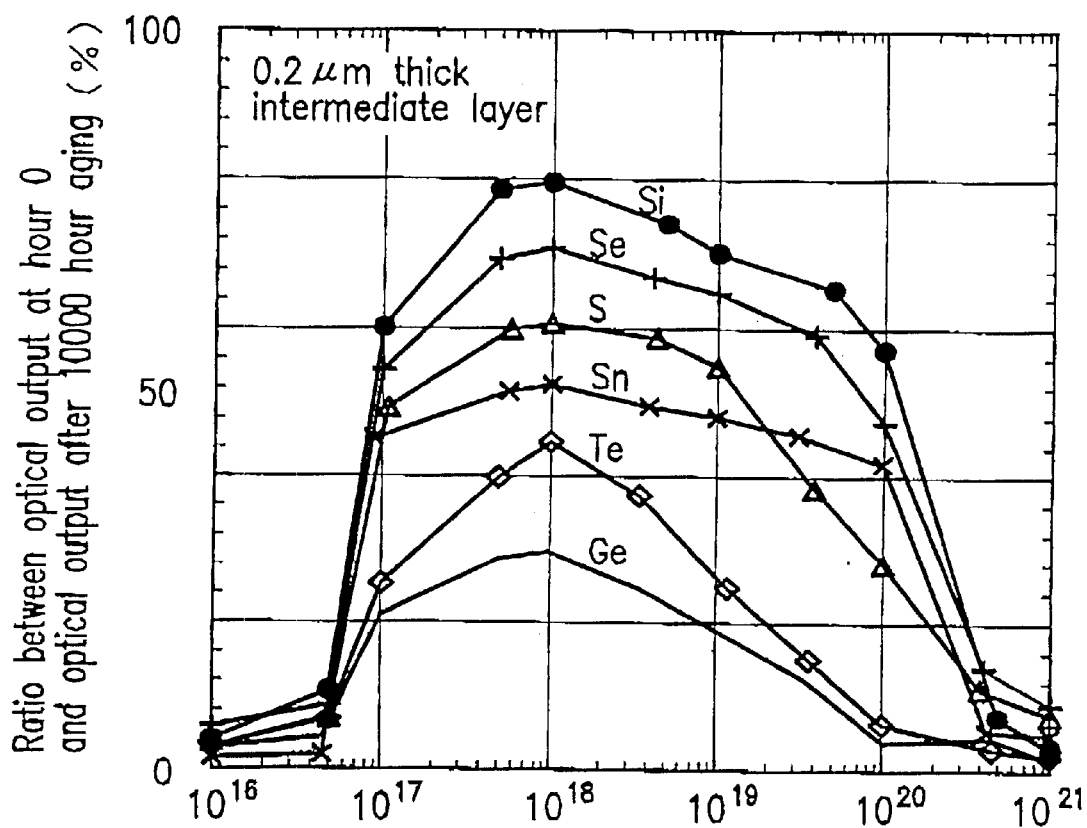
FIG. 7 is a graph illustrating the relationship between the doping concentration of a layer immediately below a light emitting layer and the ratio between the initial optical output and the optical output after about 10000 hour aging.

FIG. 7 shows the measurement results for optical output deterioration after about 10000 hour aging for various devices in which the n-GaN layer 2 has a thickness of about 0.2 μm and varied doping concentrations. In FIG. 7, the horizontal axis represents the doping concentration of a layer immediately below a light emitting layer closest to the GaN substrate (in this embodiment, the n-GaN layer 2, which is the intermediate layer section), and the vertical axis represents the ratio between the initial optical output and the optical output after about 10000 hour aging. For this measurement, Si, Se, S, Sn, Te and Ge were used as dopants for the n-GaN layer 2 (the intermediate layer section). It can be seen that when the doping concentration of the n-GaN layer 2 is about $5 \times 10^{16}$ cm$^{-3}$ or about $5 \times 10^{20}$ cm$^{-3}$, deterioration after about 10000 hour aging is significant irrespective of the dopant. A SIMS measurement detected Cl from the light emitting layer of these devices with a doping concentration of about $5 \times 10^{16}$ cm$^{-3}$. It is believed that although group IV elements such as Si and S have an effect of preventing Cl element diffusion, when the concentration of the group IV element doped into the intermediate layer section is about $5 \times 10^{16}$ cm$^{-3}$, the effect of preventing the diffusion of Cl element, which is a group VII element, is not sufficient, whereby the Cl element diffuses to the light emitting layer. Moreover, a device was produced in which the n-GaN layer 2 had a doping concentration of about $5 \times 10^{20}$ cm$^{-3}$ and observed with a TEM (transmission electron microscope) after about 10000 hour aging. The TEM observation showed that the crystallinity of the n-GaN layer 2 was poor and dislocations extended to the light emitting layer, with a high defect density in the light emitting layer.

Various devices were produced using Si, Ge, Sn, Se, S and Te as the dopants for the n-GaN layer 2 and subjected to an aging test for comparison. A device with Ge or Te as the dopant had a significant degree of deterioration, with the optical output thereof after about 10000 hour aging being less than 50% of the initial optical output. A SIMS measurement after the 10000 hour aging detected Cl element from the light emitting layer of these devices using Ge and Te as the dopants. On the other hand, in a similar measurement, the Cl concentration in the light emitting layer of a device using Si, S, Se or Sn as the dopant was less than the detection limit (about $1 \times 10^{16}$ cm$^{-3}$).

These results show that an ordinary light emitting device having desirable characteristics can be obtained as long as a group VII element is doped into the GaN substrate, and the thickness of the intermediate layer section is about 0.2 μm or more, but that it is necessary to appropriately select the type and concentration of the dopant to be added to the intermediate layer section in order to obtain a special light emitting device which is required to have an operating lifetime much longer than 1000 hours.

While the thickness of the intermediate layer section is specified as being equal to or greater than about 0.2 μm in the present embodiment, it should be understood that according to the present invention the thickness of the intermediate layer section can take any other value as long as it is sufficient to prevent the diffused group VII element from being detected in the light emitting layer.

Embodiment 2

Figure 8:
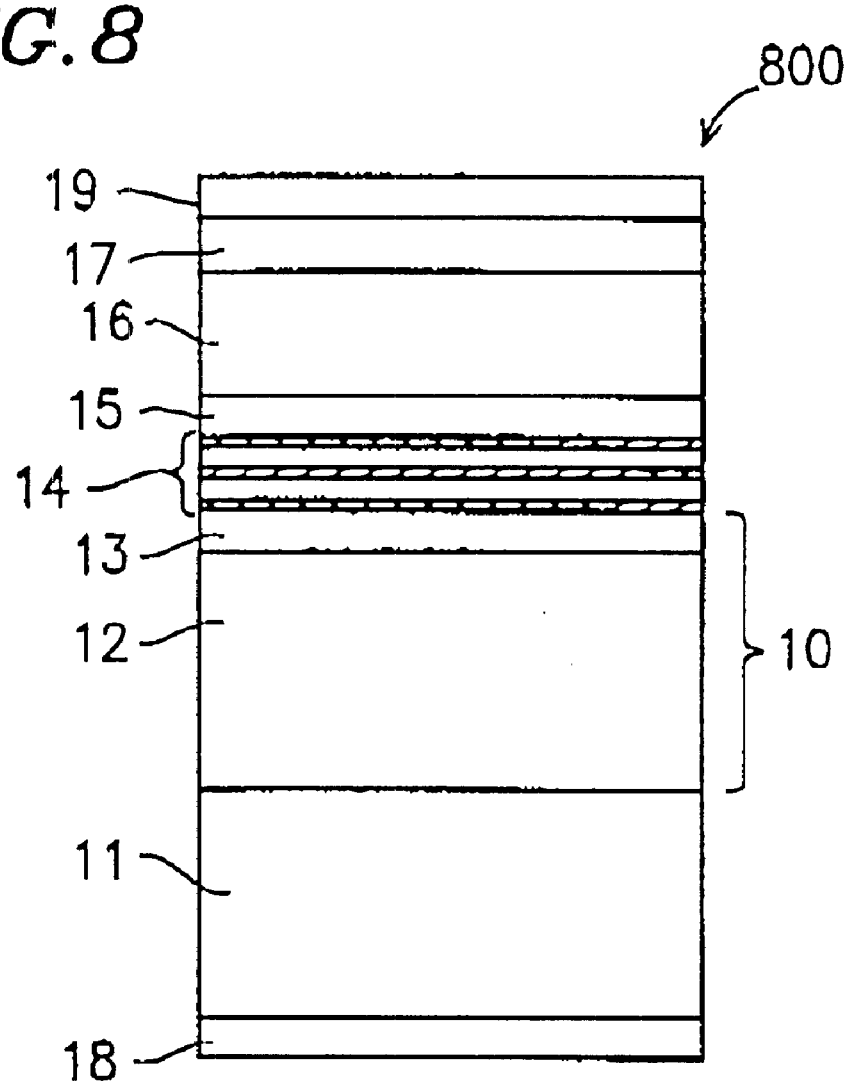
FIG. 8 is a schematic cross-sectional view illustrating a structure of a nitride semiconductor light emitting device according to one embodiment of the present invention.

FIG. 8 illustrates a structure of a nitride semiconductor light emitting device 800 according to Embodiment 2 of the present invention. The light emitting device 800 includes an n-GaN layer 12 (Si: about $1 \times 10^{19}$ cm$^{-3}$, thickness: about 0.2 μm), an n-AlGaN layer 13 (Se: about $5 \times 10^{19}$ cm$^{-3}$, thickness: about 0.1 μm), an InGaN-MQW light emitting layer 14 (emission wavelength: about 460 nm), a p-AlGaN layer 15, a p-GaN layer 16 and a p$^+$-GaN contact layer 17, which are provided in this order on an n-GaN substrate 11 (doped with Cl: about $5 \times 10^{16}$ cm$^{-3}$), thereby forming a layered structure. The light emitting device 800 further includes an n-type electrode 18 and a p-type electrode 19 respectively provided on the outermost layers of the layered structure. In this embodiment, an intermediate layer section 10 includes the n-GaN layer 12 and the n-AlGaN layer 13, and has a thickness of about 0.3 μm.

Next, a method for producing the light emitting device 800 of this embodiment will be described. First, GaN is deposited on an Si substrate while adding Cl thereto, and then only Si is selectively etched away from the substrate, thus obtaining the GaN substrate 11.

On the thus obtained Cl-doped GaN substrate 11, the n-GaN layer 12, the n-AlGaN layer 13, the InGaN-MQW light emitting layer 14, the p-AlGaN layer 15, the p-GaN layer 16 and the p$^+$-GaN contact layer 17 are deposited in this order through a known process using an MOCVD method. The following materials can be used in this embodiment. NH$_3$ gas is used as a nitrogen source, TMG gas is used as a Ga source, TMI gas is used as an In source, and trimethylaluminum (hereinafter, referred to as "TMA") gas Is used as an Al source. The n-GaN layer 12 is grown at about 1100° C., the n-AlGaN layer 13 at about 1200° C., the InGaN-MQW light emitting layer 14 at about 600° C. to about 900° C., and the p-AlGaN layer 15, the p-GaN layer 16 and the p$^+$-GaN contact layer 17 at about 1000° C.

The n-type electrode 18 and the p-type electrode 19 can be vapor-deposited through a known process using an EB vapor deposition apparatus. Ti/Al may be used as the material of the n-type electrode 18, and Pd/Au may be used as the material of the p-type electrode 19.

In contrast to Embodiment 1, the intermediate layer section 10 in this embodiment includes two or more layers, as described above. In this embodiment, as long as the total thickness of the intermediate layer section 10 is about 0.2 µm, it is possible to suppress the diffusion of Cl from the GaN substrate 11 and thus to achieve emission characteristics and lifetime characteristics comparable to those achieved in Embodiment 1. As shown in FIG. 3, the nitride semiconductor light emitting device 800 according to Embodiment 2 has a higher emission intensity and less deterioration in the emission intensity after aging than those of the nitride semiconductor light emitting device 100 according to Embodiment 1. As shown in FIG. 4, even when the total thickness of the intermediate layer section 10 is increased to about 10 µm, it is possible to realize characteristics comparative to those achieved in Embodiment 1. No substantial change in either the device characteristics or the operating lifetime was seen when the thickness ratio between these two layers (i.e., thickness of n-GaN layer 12: thickness of n-AlGaN layer 13) was varied from 1:100 to 100:1. Moreover, the effect of the present invention was similarly confirmed even when the positions of the n-GaN layer 12 and the n-AlGaN layer 13 were interchanged.

Where the intermediate layer section 10 includes two layers, in order to ensure an operating lifetime of 1000 hours, the respective dopants for the two layers may be appropriately selected from Si, Se, S, Sn, Ge and Te as illustrated in Embodiment 1, and either the same dopant or two different dopants may be selected for the two layers. In order to ensure that the optical output after about 10000 hour aging is equal to or greater than 50% of the initial optical output, the dopants for the two layers should be respectively selected from Si, Se, S and Sn. This corresponds to the results discussed in Embodiment 1 with reference to FIG. 7.

It has been confirmed that where the intermediate layer section 10 includes two layers, it is important that the concentration of the above dopants in each layer included in the intermediate layer section 10 is equal to or greater than about $1 \times 10^{15}$ cm$^{-3}$ and less than or equal to about $1 \times 10^{21}$ cm$^{-3}$ in order to prevent the diffusion of Cl from the GaN substrate 11 after about 1000 hour aging.

In the above-described embodiment, the concentration of the above dopants of each of the two layers of the Intermediate layer section 10 is equally set to about $5 \times 10^{19}$ cm$^{-3}$. Another device was produced and evaluated in which the n-GaN layer 12 was doped with Si at about $5 \times 10^{19}$ cm$^{-3}$ and the n-AlGaN layer 13 was doped with Se at about $5 \times 10^{17}$ cm$^{-3}$ while the respective thicknesses of the n-GaN layer 12 and the n-AlGaN layer 13 were the same as those in the above-described embodiment. The device characteristics after about 1000 hour aging and those after about 10000 hour aging were not substantially different from those for the device in which the two layers were doped with the same doping concentration, but the initial light intensity itself was improved (increased) by 12%. This is because the relatively heavily doped Intermediate layer, the n-GaN layer 12, (which has a substantial effect of preventing the Cl diffusion but is likely to have an increased amount of crystalline defect) is provided closer to the n-GaN substrate 11, while the relatively lightly doped intermediate layer, the n-AlGaN layer 13, (which has a relatively small effect of preventing the Cl diffusion but is capable of improving the crystallinity of the device as a base layer underlying the InGaN-MQW light emitting layer 14) is provided closer to the InGaN-MQW light emitting layer 14. With such an arrangement, it is possible to prevent the Cl diffusion while improving the internal emission efficiency. In order to achieve this, the combination of the doping concentration is not limited to that described above. Where the intermediate layer section 10 includes a plurality of layers, it is possible to improve the initial emission efficiency while improving the aging characteristics by arranging a relatively heavily doped intermediate layer closer to the n-GaN substrate 11 while arranging a lightly doped intermediate layer closer to the InGaN-MQW light emitting layer 14.

A case where the intermediate layer section 10 includes two layers has been discussed in the present embodiment. However, the intermediate layer section 10 may include three or more layers. The Cl diffusion from the n-GaN substrate 11 can be prevented by ensuring that the total thickness of the intermediate layer section 10 between the n-GaN substrate 11 and the InGaN-MQW light emitting layer 14 is equal to or greater than about 0.2 µm. The type and concentration of dopant to be used for such an intermediate layer section 10 including three or more layers can be selected in a manner similar to that described above.

Embodiment 3

Figure 9:
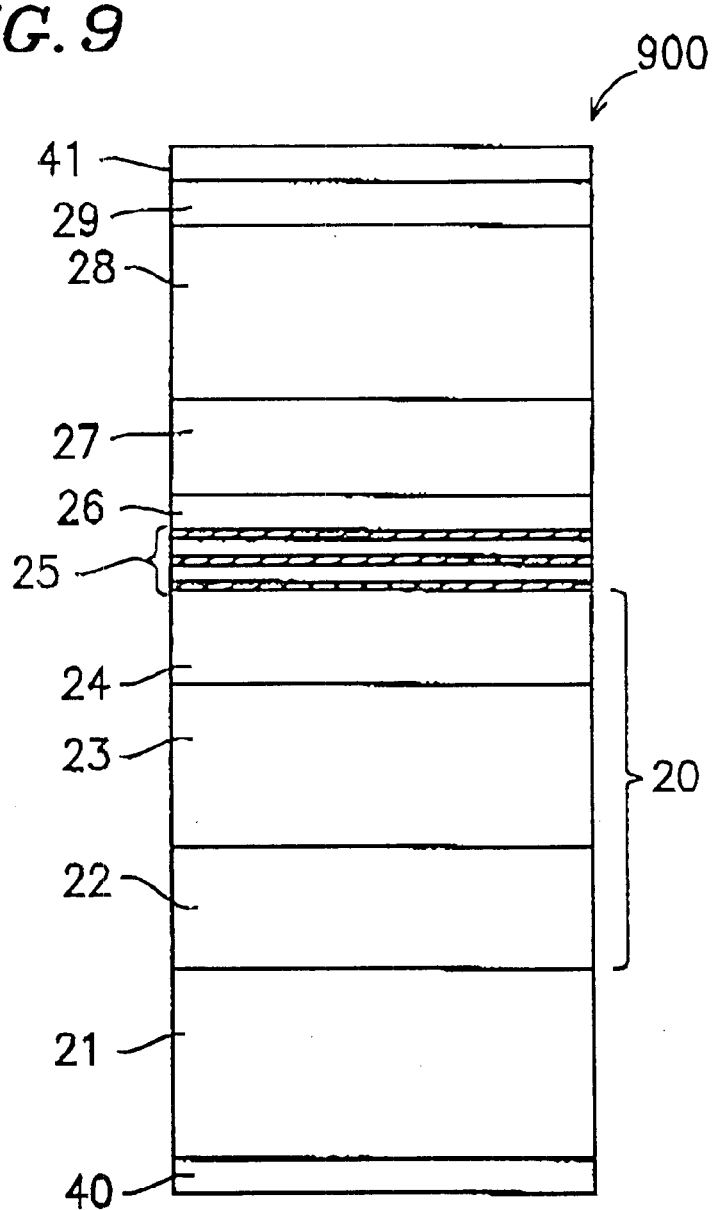
FIG. 9 is a schematic cross-sectional view illustrating a structure of a nitride semiconductor laser device using a nitride. semiconductor light emitting device according to one embodiment of the present invention.

FIG. 9 Illustrates the structure of a nitride semiconductor laser device 900 using a nitride semiconductor light emitting device according to the present invention. The laser device 900 includes an n-GaN base layer 22 (Si: about $1 \times 10^{19}$ cm$^{-3}$, thickness: about 0.05 µm), an n-AlGaN cladding layer 23 (Si: about $2 \times 10^{16}$ cm$^{-3}$, thickness: about 0.4 µm), an n-GaN guide layer 24 (Si: about $8 \times 10^{17}$ cm$^{-3}$, thickness: about 0.05 µm), an InGaN-MQW light emitting layer 25 (emission wavelength: about 460 nm), a p-AlGaN protective layer 26, a p-GaN guide layer 27, a p-AlGaN cladding layer 28 and a p$^+$-GaN contact layer 29, which are provided in this order on an n-GaN substrate 21, thereby forming a layered structure. The laser device 900 further includes an n-type electrode 40 and a p-type electrode 41 respectively provided on the outermost layers of the layered structure. In this embodiment, an intermediate layer section 20 includes the n-GaN base layer 22, the n-AlGaN cladding layer 23 and the n-GaN guide layer 24.

The n-GaN substrate 21 can be obtained by first depositing GaN on an Si substrate while adding Cl thereto, and then selectively etching away Si from the substrate.

On the thus obtained Cl-doped GaN substrate 21 (Cl: about $2 \times 10^{16}$ cm$^{-3}$), the n-GaN base layer 22, the n-AlGaN cladding layer 23, the n-GaN guide layer 24, the InGaN-MQW light emitting layer 25, the p-AlGaN protective layer 26, the p-GaN guide layer 27, the p-AlGaN cladding layer 28 and the p$^+$-GaN contact layer 29 are deposited In this order through a known process using an MOCVD method. The following materials can be used in this embodiment. NH$_3$ gas is used as a nitrogen source, TMG gas is used as a Ga source, TMI gas is used as an In source, and TMA gas is used as an Al source. The n-GaN base layer 22 is grown at about 1100° C., the n-AlGaN cladding layer 23 at about 1200° C., the InGaN-MQW light emitting layer 25 at about 600° C. to about 900° C., and the p-AlGaN protective layer 26, the p-GaN guide layer 27, the p-AlGaN cladding layer 28 and the p$^+$-GaN contact layer 29 at about 1000° C. Neither Cl nor any other group VII element was intentionally added to the three layers 22, 23 and 24 included in the intermediate layer section 20. The intermediate layer section 20 was formed so that the concentration of group VII element such as Cl, Br, I, or the like, which remains in these layers was less than about $1\times10^{16}$ cm$^{-3}$.

The n-type electrode 40 and the p-type electrode 41 were vapor-deposited through a known process using an EB vapor deposition apparatus. It is noted that the p-type electrode 41 was actually formed in stripes of about 3 μm width, and that FIG. 9 illustrates a cross section of the laser device 900 taken along a land portion of the stripe pattern. Ti/Al was used as the material of the n-type electrode 40, and Pd/Au was used as the material of the p-type electrode 41. The laser cavity end face was created by cleaving the produced wafer.

The operating lifetime of the laser device 900 was examined by operating the laser device 900 under an about 60° C. atmosphere so that the laser light output is held at about 30 mW. Even after 5000 hour aging, the threshold current was only increased by 1.07 from the initial threshold current and the laser device 900 did not significantly deteriorate. As the operating lifetime examination was further continued, it was found that the period of time taken for the threshold current to be increased by 1.2 from the initial threshold current (the operating lifetime) was 12000 hours. This is a sufficient operating lifetime for the laser device 900 to be used for an optical disk, or the like. Thus, it was confirmed that the utility of the laser device 900 was very high. This is because the intermediate layer section 20 containing less than about $1\times10^{16}$ cm$^{-3}$ of a group VII element was provided between the n-GaN substrate 21 doped with Cl at about $2\times10^{16}$ cm$^{-3}$ and the light emitting layer 25, as in Embodiments 1 and 2 above, thereby suppressing the amount of Cl reaching the vicinity of the light emitting layer 25 and the deterioration of the emission characteristics and the laser oscillation characteristics.

In the above-described embodiment, Si was used as the dopant for the intermediate layer section 20. However, an operating lifetime comparable to that described above was confirmed also when any of Se, S and Sn was used as the dopant and when different dopants were used for the respectively layers. When only the dopant concentration of the intermediate layer section 20 was varied, operating lifetimes exceeding 10000 hours were obtained when the dopant concentration was equal to or greater than about $1\times10^{16}$ cm$^{-3}$ and less than or equal to about $1\times10^{19}$ cm$^{-3}$. When a layer containing a dopant at a concentration over about $1\times10^{19}$ cm$^{-3}$ is present in the vicinity of the light emitting layer 25, there is an increased absorption by excessive free carriers, thus increasing the oscillation threshold current, whereby the operating lifetime is as short as 1000 hours or less. The Si dopant concentration of the n-GaN base layer 22 can be increased up to about $1\times10^{21}$ cm$^{-3}$ when the thicknesses of the three layers of the intermediate layer section 20 are set such that the n-GaN base layer 22 is about 0.85 μm thick, the n-AlGaN cladding layer 23 is about 0.8 μm thick and the n-GaN guide layer 24 is 0.15 μm thick so that the majority of the generated laser light is confined in a portion close to the light emitting layer 25 away from the n-AlGaN cladding layer 23. Thus, it is possible to effectively prevent the Cl diffusion from the n-GaN substrate 21, ensure a high optical gain in the light emitting layer 25 (which is essential for a laser device), and to realize a low threshold current (35 mA in this embodiment), by selecting the dopant concentration for the n-GaN base layer 22 to be equal to or greater than about $1\times10^{19}$ cm$^{-3}$ and less than or equal to about $1\times10^{21}$ cm$^{-3}$ while selecting the dopant concentration for the n-AlGaN cladding layer 23 and the n-GaN guide layer 24 (which are present in a region of the device where the laser light is distributed) to be equal to or greater than about $1\times10^{16}$ cm$^{-3}$ and less than or equal to about $1\times10^{19}$ cm$^{-3}$.

In the laser device 900 of the present embodiment, the total thickness of the intermediate layer section 20 (in this embodiment, the n-GaN base layer 22, the n-AlGaN cladding layer 23 and n-GaN guide layer 24) provided between the n-GaN substrate 21 and the light emitting layer 25 was set to about 0.5 μm. Another laser device similar to the laser device 900 was produced while changing the thickness of the intermediate layer section 20, and the threshold current after 5000 hour aging was examined. An operating lifetime over 10000 hours was realized when the total thickness of the intermediate layer section 20 was equal to or greater than about 0.5 μm. Other devices in which the thickness of the intermediate layer section 20 was greater than about 10 μm had various characteristics substantially the same as those described above. In practice, an intermediate layer section thickness of about 10 μm should be sufficient. Where the total thickness of the intermediate layer section 20 was increased to be equal to or greater than about 1.5 μm, it was possible to reduce the threshold current and thus to ensure a long operating lifetime by setting the thickness of the n-AlGaN cladding layer 23 to be less than or equal to about 1.5 μm while providing two GaN layers accounting for the balance thickness. Thus, it was found that the thickness of the n-AlGaN cladding layer 23 should be selected to be at most about 1.5 μm. It is believed that when the thickness of the AlGaN layer exceeds about 1.5 μm, the crystalline dislocations and the N atom positive holes increase, via which the Cl element abnormally diffuses from the n-GaN substrate 21, thereby lowering the function as the intermediate layer section 20.

As described above, the present invention can also be applied to a nitride semiconductor laser device, in which case the intermediate layer section can be formed as specified herein, whereby it is possible to realize a violet color (wavelength band: about 400 nm to about 420 nm) semiconductor laser device having a prolonged operating lifetime which is capable of effectively suppressing the diffusion of the group VII element from the n-GaN substrate 21 to the light emitting layer 25.

In the above-described embodiment, GaN is used for the n-GaN base layer 22 and the n-GaN guide layer 24. Alternatively, an InGaN ternary mixed semiconductor material obtained by adding about 1% to about 20% of In to GaN can be used. About 1% to about 20% of In can also be added to the n-AlGaN cladding layer 23 so as to obtain an AlGaInN quaternary layer.

Embodiment 4

Figure 10:
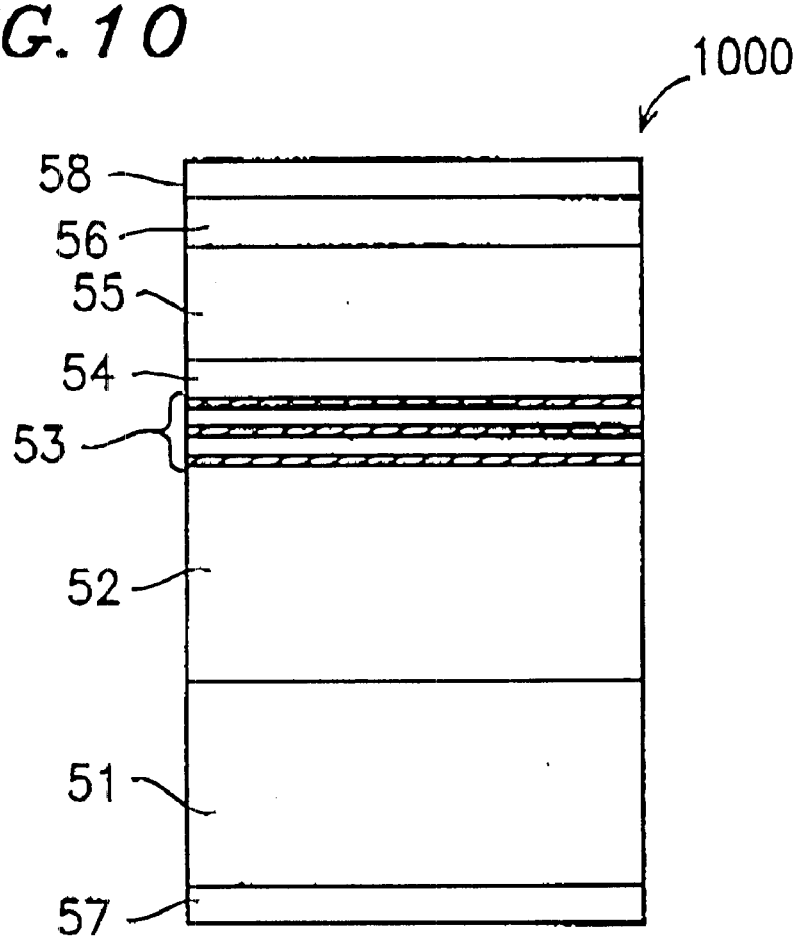
FIG. 10 is a schematic cross-sectional view illustrating a structure of a nitride semiconductor light emitting device according to one embodiment of the present invention.

FIG. 10 illustrates a nitride semiconductor light emitting device 1000 using a p-type substrate according to Embodiment 4 of the present invention. The nitride semiconductor light emitting device 1000 is similar to the nitride semiconductor light emitting device 100 except that a p-type substrate is used with necessary changes associated therewith. The light emitting device 1000 includes a p-GaN intermediate layer 52 (Mg: about $5\times10^{19}$ cm$^{-3}$, Cl: less than about $1\times10^{16}$ cm$^{-3}$) an InGaN-MQW light emitting layer 53 (emission wavelength: about 460 nm) and an n-GaN layer 54, which are provided in this order on a p-GaN substrate 51 (doped with Cl: about $5\times10^{16}$ cm$^{-3}$). Various such devices were produced while varying only the thickness of the p-GaN layer 52, and the emission intensity was measured after about 1000 hour aging. Again, the lifetime characteristics were desirable when the thickness of the p-GAN layer was equal to or greater than about 0.2 μm. A device in which the layer (intermediate layer section) provided between the p-GaN substrate and the light emitting layer was about 0.1

μm had a significant reduction in the emission intensity after aging. This was explained by a SIMS measurement of such a device, which showed the presence of Cl in the light emitting layer.

Desirable characteristics can be obtained when the Mg concentration of the p-GaN layer 52 is in the range of about $1\times10^{16}$ cm$^{-3}$ to about $5\times10^{20}$ cm$^{-3}$.

Light emitting devices according to the present embodiment in which a p-GaN layer was used as the intermediate layer section all had significant deterioration after about 1000 hour aging.

The light emitting device 1000 described above includes the p-GaN layer 52, the InGaN-MQW light emitting layer 53 and the n-GaN layer 54, which are provided in this order on the p-GaN substrate 51. Alternative light emitting devices were produced in which a p-GaN layer, a p-AlGaN layer, an InGaN-MQW light emitting layer and an n-GaN layer were provided in this order on the p-GaN substrate 51 (thus, the intermediate layer section had a two-layer structure including the p-GaN layer and the p-AlGaN layer), while varying the thickness of the intermediate layer section (i.e., the total thickness of the p-GaN layer and the p-AlGaN layer). Those devices in which the thickness of the intermediate layer section was in the range of about 0.2 μm to about 10 μm survived a 1000 hour aging test, but did not survive a 10000 hour aging test.

When C, which is a group IV element, was used as the dopant for the intermediate layer section, the device had aging test results comparable to those for devices using Mg. Specifically, the devices with C had desirable lifetime characteristics in a 1000 hour aging test, but did not survive a 10000 hour aging test.

Figure 11:
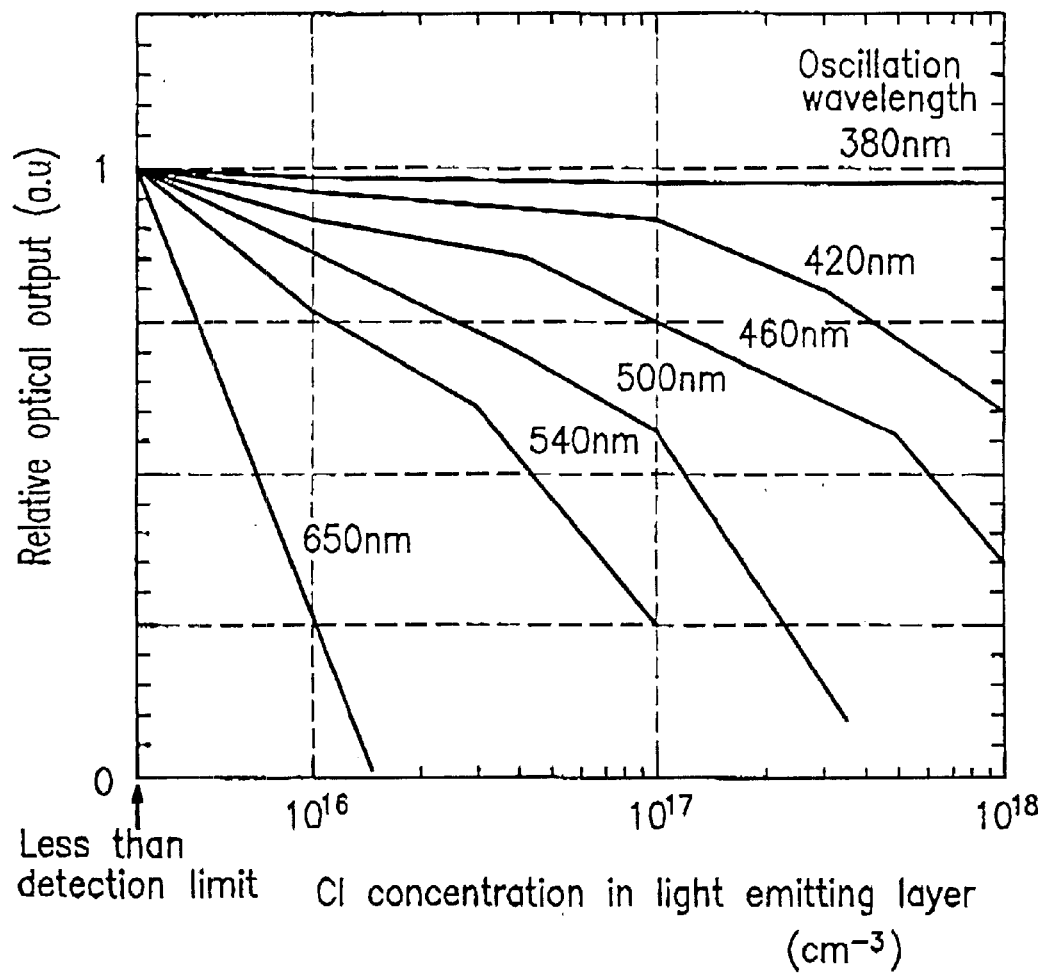
FIG. 11 is a graph illustrating the relationship between the emission intensity (relative optical output) and the Cl concentration in the light emitting layer, wherein the emission intensity is calculated based on the emission intensity set equal to one for a device whose Cl concentration in the light emitting layer is less than the detection limit.
Figure 12:
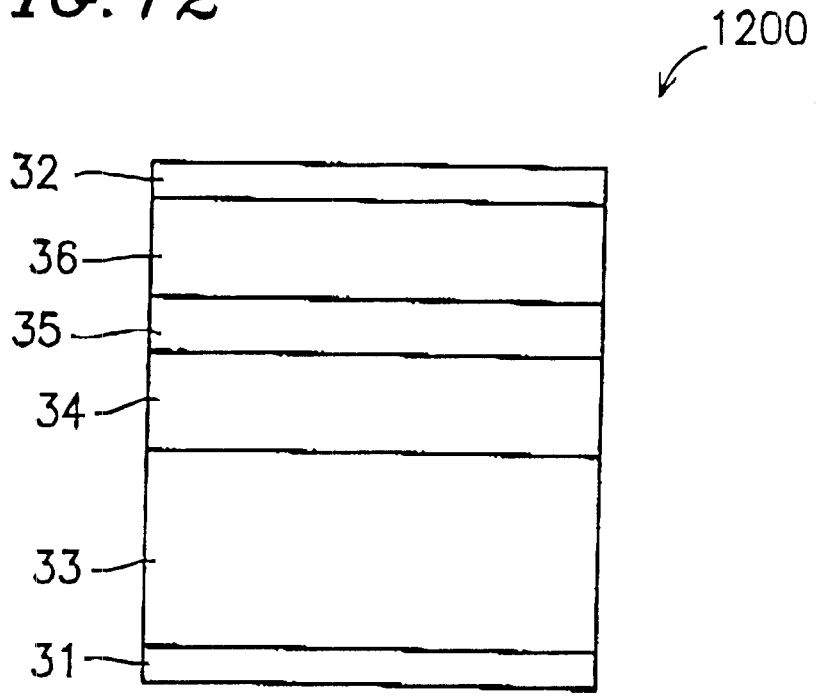
FIG. 12 is a schematic cross-sectional view illustrating a structure of a conventional nitride semiconductor light emitting device.

Embodiments 1 to 4 above are all directed to a device whose emission wavelength is about 460 nm. However, it is understood that the present invention is not limited to the emission wavelength of about 460 nm. FIG. 11 shows the relationship between the emission intensity and the Cl concentration in the light emitting layer. In FIG. 11, the optical output along the vertical axis is a relative optical output calculated based on the emission intensity set equal to 1 for a device whose Cl concentration in the light emitting layer is less than the detection limit. FIG. 11 shows the relationship between the Cl concentration in the light emitting layer and the emission intensity for various devices having different emission wavelengths. As shown in FIG. 11, in a nitride semiconductor light emitting device, the longer the emission wavelength is, the greater is the influence of a group VII element in the light emitting layer. It is believed that as the emission wavelength is greater (i.e., as the In content is greater), more distortion is introduced into the active layer, whereby the influence of Cl is more pronounced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride semiconductor light emitting device, comprising:
   a GaN substrate into which a group VII element is doped;
   an intermediate layer section provided on the GaN substrate; and
   a light emitting layer provided on the intermediate layer section, wherein
   the intermediate layer section has a sufficient thickness to prevent the group VII element diffused from the GaN substrate from being detected in the light emitting layer,
   wherein the intermediate layer section comprises a plurality of layers including an n-GaN base layer, an n-AlGaN cladding layer and an n-InGaN guide layer, which are arranged in this order from the GaN substrate side,
   wherein said intermediate layer includes a material selected from the group consisting of Si, Se, S, Sn, Te, Ge and Mg, and
   wherein the GaN substrate is in contact with an ohmic electrode.

2. A nitride semiconductor light emitting device according to claim 1, wherein the thickness of the intermediate layer section is equal to or greater than about 0.2 μm.

3. A nitride semiconductor light emitting device according to claim 1, wherein the group VII element has a concentration in a range of about $1\times10^{16}$ cm$^{-3}$ to about $1\times10^{20}$ cm$^{-3}$.

4. A nitride semiconductor light emitting device according to claim 1, wherein the intermediate layer section comprises a layer into which a group IV element or a group VI element is doped in a range of, about $1\times10^{17}$ cm$^{-3}$ to about $1\times20$ cm$^{-3}$.

5. A nitride semiconductor light emitting device according to claim 1, wherein the group VII element is Cl.

6. A nitride semiconductor light emitting device according to claim 1, wherein the GaN substrate is an n-type substrate, and the dopant for the intermediate layer section is an n-type dopant.

7. A nitride semiconductor light emitting device according to claim 1, wherein;
   the intermediate layer section comprises a plurality of doped nitride semiconductor layers;
   one of the plurality of doped nitride semiconductor layers closest to the GaN substrate has a dopant concentration which in greater than that of another one of the plurality of doped nitride semiconductor layers closest to the light emitting layer.

8. A nitride semiconductor light emitting device comprising:
   a GaN substrate into which a group VII element is doped;
   an intermediate layer section provided on the GaN substrate; and
   a light emitting layer provided on the intermediate layer section,
   wherein the intermediate layer section has a sufficient thickness to prevent the group VII element diffused from the GaN substrate from being detected in the light emitting layer, and
   wherein the nitride semiconductor light emitting device is a semiconductor laser device;
   the intermediate layer section comprises a plurality of layers including an n-InGaN base layer, an n-AlGaN cladding layer and an n-InGaN guide layer, which are arranged in this order from the GaN substrate side; and
   the intermediate layer section has a total thickness equal to or greater than about 0.5 μm.

9. A nitride semiconductor light emitting device according to claim 8, wherein a dopant concentration in the n-AlGaN cladding layer and the n-InGaN guide layer of the intermediate layer section in equal to or greater than about $1\times10^{17}$ cm$^{-3}$ and less than or equal to about $1\times10^{19}$ cm$^{-3}$.

10. A nitride semiconductor light emitting device according to claim 8, wherein the n-AlGaN cladding layer has a thickness less than or equal to about 1.5 μm.

11. A nitride semiconductor light emitting device comprising:
   a GaN substrate into which a group VII element is doped;
   an intermediate layer section provided on the GaN substrate; and
   a light emitting layer provided on the intermediate layer section,
   wherein the intermediate layer section has a sufficient thickness to prevent the group VII element diffused from the GaN substrate from being detected in the light emitting layer; and
   wherein the nitride semiconductor light emitting device is a semiconductor laser device;
   the intermediate layer section comprises a plurality of layers including an n-InGaN base layer, an n-AlGaInN cladding layer and an n-InGaN guide layer, which are arranged in this order from the GaN substrate side; and
   the intermediate layer section has a total thickness equal to or greater than about 0.5 μm.

12. A nitride semiconductor light emitting device according to claim 11, wherein a dopant concentration in the n-AlGaInN cladding layer and the n-InGaN guide layer of the intermediate layer section is equal to or greater than about $1\times10^{17}$ cm$^{-3}$ and less than or equal to about $1\times10^{19}$ cm$^{-3}$.

13. A nitride semiconductor light emitting device according to claim 11, wherein the n-AlGaInN cladding layer has a thickness less than or equal to about 1.5 μm.

14. A nitride semiconductor light emitting device, comprising:
   a GaN substrate into which a group VII element is doped;
   an intermediate layer section provided on the GaN substrate; and
   a light emitting layer provided on the intermediate layer section, wherein
      the intermediate layer section has a sufficient thickness to prevent the group VII element diffused from the GaN substrate from being detected in the light emitting layer;
      wherein the intermediate layer section comprises a plurality of layers including an n-GaN base layer, an n-AlGaN cladding layer and an n-InGaN guide layer, which are arranged in this order from the GaN substrate side,
   wherein said intermediate layer is produced through a MOCVD method and
   wherein the GaN substrate is in contact with an ohmic electrode.

15. A nitride semiconductor light emitting device according to claim 14, wherein the thickness of the intermediate layer section is equal to or greater than about 0.2 μm.

16. A nitride semiconductor light emitting device according to claim 14, wherein the group VII element has a concentration in a range of about $1\times10^{16}$ cm$^{-3}$ to about $1\times10^{20}$ cm$^{-3}$.

17. A nitride semiconductor light emitting device according to claim 14, wherein the intermediate layer section comprises a layer into which a group IV element or a group VI element is doped in a range of about $1\times10^{17}$ cm$^{-3}$ to about $1\times10^{20}$ cm$^{-3}$.

18. A nitride semiconductor light emitting device according to claim 14, wherein the group VII element is Cl.

19. A nitride semiconductor light emitting device according to claim 14, wherein the GaN substrate is an n-type substrate, and the dopant for the intermediate layer section is an n-type dopant.

20. A nitride semiconductor light emitting device according to claim 14, wherein:
   the intermediate layer section comprises a plurality of doped nitride semiconductor layers;
   one of the plurality of doped nitride semiconductor layers closest to the GaN substrate has a dopant concentration which is greater than that of another one of the plurality of doped nitride semiconductor layers closest to the light emitting layer.

21. A nitride semiconductor light emitting device, comprising:
   a GaN substrate into which a group VII element is doped;
   an intermediate layer section provided on the GaN substrate; and
   a light emitting layer provided on the intermediate layer section, wherein
      the intermediate layer section has a sufficient thickness to prevent the group VII element diffused from the GaN substrate from being detected in the light emitting layer,
      wherein the intermediate layer section comprises a plurality of layers including an n-GaN base layer, an n-AlGaN cladding layer and an n-InGaN guide layer, which are arranged in this order from the GaN substrate side,
   wherein said light emitting device comprises two electrodes respectively provided on the outermost layers of the layered structure and
   wherein the GaN substrate is in contact with one of said electrodes.

22. A nitride semiconductor light emitting device according to claim 21, wherein the thickness of the intermediate layer section to equal to or greater than about 0.2 μm.

23. A nitride semiconductor light emitting device according to claim 21, wherein the group VII element has a concentration in a range of about $1\times10^{16}$ cm$^{-3}$ to about $1\times10^{20}$ cm$^{-3}$.

24. A nitride semiconductor light emitting device according to claim 21, wherein the intermediate layer section comprises a layer into which a group IV element or a group VI element is doped in a range of about $1\times10^{17}$ cm$^{-3}$ to about $1\times10^{20}$ cm$^{-3}$.

25. A nitride semiconductor light emitting device according to claim 21, wherein the group VII element is Cl.

26. A nitride semiconductor light emitting device according to claim 21, wherein the GaN substrate is an n-type substrate, and the dopant for the intermediate layer section in an n-type dopant.

27. A nitride semiconductor light emitting device according to claim 21, wherein:
   the intermediate layer section comprises a plurality of doped nitride semiconductor layers;
   one of the plurality of doped nitride semiconductor layers closest to the GaN substrate has a dopant concentration which is greater than that of another one of the plurality of doped nitride semiconductor layers closest to the light emitting layer.

28. A nitride semiconductor light emitting device, comprising:
   a GaN substrate into which a group VII element is doped;
   an intermediate layer section provided on the GaN substrate; and
   a light emitting layer provided on the intermediate layer section, wherein
      the intermediate layer section comprises a plurality of layers including an n-GaN base layer, an n-AlGaN cladding layer and an n-InGaN guide layer, which are arranged in this order from the GaN substrate side, the intermediate layer section has a sufficient thickness to prevent the group VII element diffused from the GaN substrate from being detected in the light emitting layer; and wherein a thickness of said intermediate layer is equal to or more than 0.1 μm and wherein the GaN substrate is in contact with an ohmic electrode.

29. A nitride semiconductor light emitting device according to claim 28, wherein the thickness of the intermediate layer section is equal to or greater than about 0.2 μm.

30. A nitride semiconductor light emitting device according to claim 28, wherein the group VII element has a concentration in a range of about $1 \times 10^{16}$ cm$^{-3}$ to about $1 \times 10^{20}$ cm$^{-3}$.

31. A nitride semiconductor light emitting device according to claim 28, wherein the intermediate layer section comprises a layer into which a group IV element or a group VI element is doped in a range of about $1 \times 10^{17}$ cm$^{-3}$ to about $1 \times 10^{20}$ cm$^{-3}$.

32. A nitride semiconductor light emitting device according to claim 28, wherein the group VII element is Cl.

33. A nitride semiconductor light emitting device according to claim 28, wherein the GaN substrate is an n-type substrate, and the dopant for the intermediate layer section is an n-type dopant.

34. A nitride semiconductor light emitting device according to claim 28, wherein:

the intermediate layer section comprises a plurality of doped nitride semiconductor layers;

one of the plurality of doped nitride semiconductor layers closest to the GaN substrate has a dopant concentration which is greater than that of another one of the plurality of doped nitride semiconductor layers closest to the light emitting layer.

* * * * *